(12) United States Patent
Waskiewicz et al.

(10) Patent No.: US 11,908,923 B2
(45) Date of Patent: Feb. 20, 2024

(54) LOW-RESISTANCE TOP CONTACT ON VTFET

(71) Applicant: International Business Machines Corporation, Armonk, NY (US)

(72) Inventors: Christopher J. Waskiewicz, Rexford, NY (US); Su Chen Fan, Cohoes, NY (US); Hari Prasad Amanapu, Guilderland, NY (US); Hemanth Jagannathan, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 17/026,451

(22) Filed: Sep. 21, 2020

(65) Prior Publication Data

US 2021/0005735 A1    Jan. 7, 2021

Related U.S. Application Data

(63) Continuation of application No. 16/117,106, filed on Aug. 30, 2018, now Pat. No. 10,833,173.

(51) Int. Cl.
*H01L 21/8234* (2006.01)
*H01L 29/66* (2006.01)
*H01L 29/08* (2006.01)
*H01L 21/768* (2006.01)
*H01L 29/78* (2006.01)

(52) U.S. Cl.
CPC .. *H01L 29/66666* (2013.01); *H01L 21/76877* (2013.01); *H01L 29/0847* (2013.01); *H01L 29/7827* (2013.01)

(58) Field of Classification Search
CPC .................. H01L 21/823487; H01L 29/66666
See application file for complete search history.

(56) References Cited

U.S. PATENT DOCUMENTS

| | | | |
|---|---|---|---|
| 5,668,065 | A | 9/1997 | Lin |
| 5,998,252 | A | 12/1999 | Huang |
| 6,329,276 | B1 | 12/2001 | Ku et al. |
| 7,241,655 | B2 | 7/2007 | Tang et al. |
| 9,530,866 | B1 | 12/2016 | Zhang et al. |
| 9,653,575 | B1 | 5/2017 | Basker et al. |
| 9,773,708 | B1 | 9/2017 | Zhang et al. |

(Continued)

OTHER PUBLICATIONS

Ashish Agrawal et al., "Fermi level depinning and contact resistivity reduction using a reduced titania interlayer in n-silicon metal-insulator-semiconductor ohmic contacts" Applied Physics Letters 104, 112101 (2014) (5 pages).

(Continued)

*Primary Examiner* — Mark V Prenty
(74) *Attorney, Agent, or Firm* — Cantor Colburn LLP; L. Jeffrey Kelly

(57) ABSTRACT

A semiconductor includes a semiconductor substrate having a bottom source/drain region and a vertical semiconductor fin having a bottom end that contacts the semiconductor substrate. The semiconductor device further includes a top source/drain region on a top end of the vertical semiconductor. The top source/drain region is separated from the semiconductor substrate by the vertical semiconductor fin. The semiconductor device further includes an electrically conductive cap on an outer surface of the top source/drain region.

7 Claims, 14 Drawing Sheets

(56) References Cited

U.S. PATENT DOCUMENTS

| | | | |
|---|---|---|---|
| 9,859,166 B1 | 1/2018 | Cheng et al. | |
| 9,859,421 B1 | 1/2018 | Robison et al. | |
| 9,899,515 B1 | 2/2018 | Cheng et al. | |
| 10,361,315 B1 | 7/2019 | Yeh et al. | |
| 10,833,173 B2 * | 11/2020 | Waskiewicz | H01L 29/66666 |
| 11,145,736 B2 * | 10/2021 | Zhou | H01L 29/66795 |
| 2004/0029372 A1 | 2/2004 | Jang et al. | |
| 2017/0084753 A1 | 3/2017 | Lien et al. | |
| 2018/0005904 A1 | 1/2018 | Lee et al. | |
| 2020/0075746 A1 | 3/2020 | Waskiewicz et al. | |

OTHER PUBLICATIONS

IBM "List of IBM Patents or Patent Applictions Treated as Related; (Appendix P)", Filed Sep. 22, 2020 (2 pages).

\* cited by examiner

LOW-RESISTANCE TOP CONTACT ON VTFET

DOMESTIC PRIORITY

This application is a continuation of U.S. application Ser. No. 16/117,106, filed Aug. 30, 2018, the contents of which are incorporated by reference herein in its entirety.

BACKGROUND

The present invention generally relates to fabrication methods and resulting structures for semiconductor devices. More specifically, the present invention relates to top source/drain contact resistance reductions in vertical-type FETs.

In contemporary semiconductor device fabrication processes, a large number of semiconductor devices, such as field effect transistors (FETs), are fabricated on a single wafer. Some non-planar transistor architectures, such as vertical-type field effect transistors (VTFETs), employ semiconductor fins and side-gates that can be contacted outside the active region, resulting in increased device density and some increased performance over lateral devices. In VTFETs the bottom source/drain (BSD) to top source/drain (TSD) current flows in a direction that is perpendicular to a major surface of the substrate. For example, in a known VTFET configuration a major substrate surface is horizontal and a vertical fin or nanowire extends upward from the substrate surface. The fin or nanowire forms the channel region of the transistor. Accordingly, a BSD region and a TSD region are situated in electrical contact with the bottom and top ends of the channel region, respectively, while the gate is disposed therebetween and surrounds one or more of the fin or nanowire sidewalls.

SUMMARY

Embodiments of the present invention are directed to a method for fabricating a semiconductor device. A non-limiting example of the method includes forming a bottom source/drain region on a semiconductor substrate. The method further includes forming a vertical semiconductor fin including a bottom end that contacts the semiconductor substrate and is in electrical communication with the bottom source/drain region. The method further includes forming a top source/drain region on a top end of the vertical semiconductor. The top source/drain region is separated from the semiconductor substrate by the vertical semiconductor fin. The method further includes forming an electrically conductive cap on an outer surface of the top source/drain region, and forming an electrically conductive contact via in ohmic connection with the electrically conductive cap to establish an electrically conductive path from the contact via to the bottom source/drain region.

Embodiments of the present invention are directed to a method for fabricating a semiconductor device. A non-limiting example of the method includes forming a vertical semiconductor fin including a bottom end that contacts a semiconductor substrate, and forming a top source/drain region on a top end of the vertical semiconductor. The top source/drain region is separated from the semiconductor substrate by the vertical semiconductor fin. The method further comprises forming an electrically conductive cap on an outer surface of the top source/drain region, and forming a first dielectric trench liner adjacent a first side of the electrically conductive cap and forming a second dielectric liner adjacent a second side of the electrically conductive cap opposite the first side. The method further includes forming an electrically conductive contact via between the first and second dielectric liners and in ohmic connection with the electrically conductive cap.

Embodiments of the invention are directed to a semiconductor device. A non-limiting example of the semiconductor device includes a semiconductor substrate including a bottom source/drain region, and a vertical semiconductor fin including a bottom end contacting the semiconductor substrate. The semiconductor device further includes a top source/drain region on a top end of the vertical semiconductor. The top source/drain region is separated from the semiconductor substrate by the vertical semiconductor fin. The semiconductor device further includes an electrically conductive cap on an outer surface of the top source/drain region.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, VTFETs employ a BSD region formed from a region of the substrate, while the TSD region is typically grown from the top end of the channel using an epitaxy (epi) process. As a result, the TSD is smaller is size compared to the BSD. The smaller TSD region provides less available contact area compared to the BSD region, thereby resulting in a higher TSD contact resistance compared to the BSD contact resistance. Furthermore, formation of the TSD contact element can result in over-gouging deep into the TSD epi thereby reducing the overall epi material in the TSD and further increasing the resistance in the TSD region.

Turning now to an overview of aspects of the present invention, one or more embodiments of the present invention provide methods and structures configured to reduce the resistance in the TSD region of a VTFET. In one or more embodiments of the invention, an electrically conductive cap is formed on the TSD region, which reduces the resistance between the TSD region and a subsequently formed TSD contact element. Not only is the electrically conductive cap formed from a low-resistance material (e.g., a metal material), it increases the overall contact area available to the TSD contact element. In this manner, the overall contact resistance in the TSD region of the VTFET is reduced.

Figure 1:
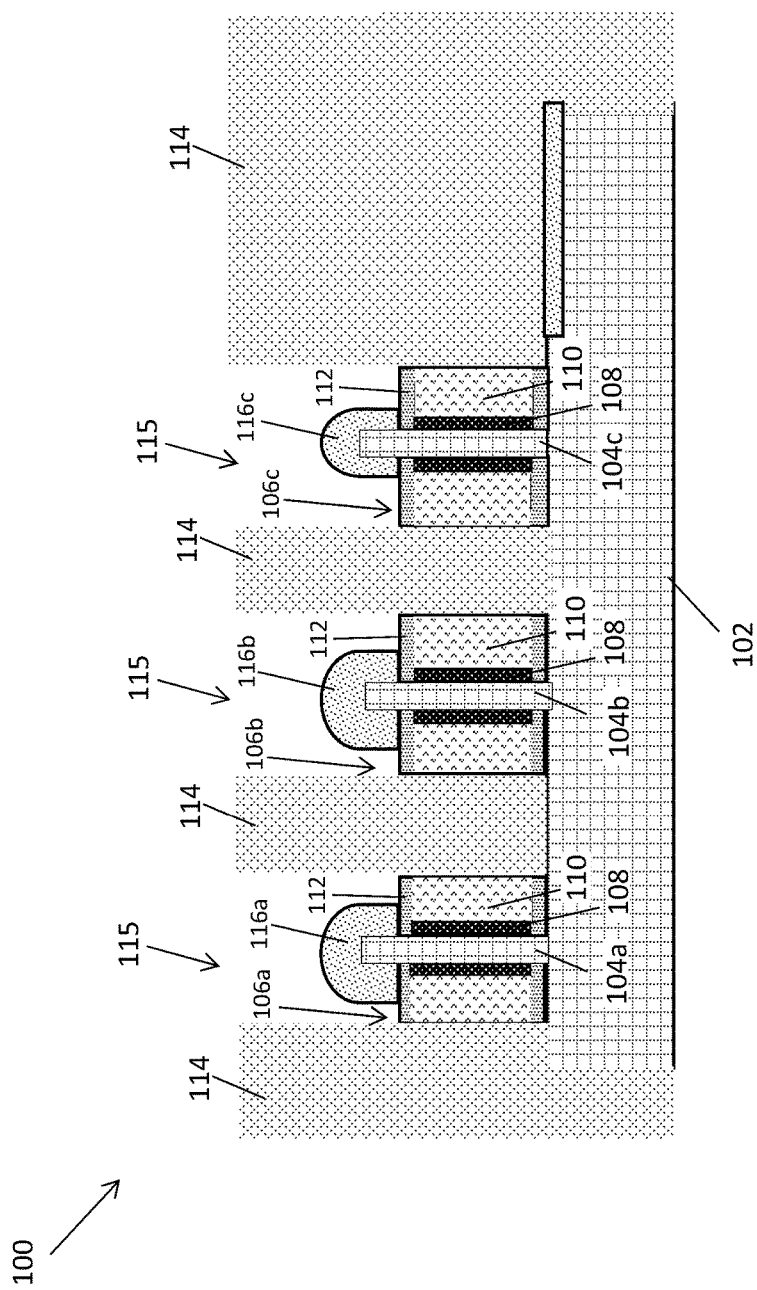
FIG. 1 depicts a cross-sectional view of a semiconductor structure after a processing operation according to one or more embodiments of the present invention.

Turning now to a more detailed description of aspects of the present invention, FIG. 1 depicts a cross-sectional view of a semiconductor structure 100 including a semiconductor substrate 102 and a plurality of vertical semiconductor fins 104a, 104b, 104c formed on the substrate 102 during an intermediate operation of a method of fabricating a semiconductor device according to one or more embodiments of the invention.

The semiconductor structure 100 further includes conductive gate structures 106a, 106b, 106c formed on the outer surface of a respective fin 104a, 104b, 104c. The gate structures 106a, 106b, 106c are formed to surround a portion of the fins 104a, 104b, 104c and define a fin channel region using known VFET processes. In some embodiments of the present invention the gate structures 106a, 106b, 106c can be formed as a high-k metal gate (HKMG) and can include, for example, one or more high-k dielectric films 108 and one or more work function metals 110.

The high-k dielectric film 108 can be a dielectric material having a dielectric constant greater than, for example, 3.9, 7.0, or 10.0. Non-limiting examples of suitable materials for the high-k dielectric films 108 include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric film 108 can further include dopants such as, for example, lanthanum and aluminum. The high-k dielectric films 108 can be formed by suitable deposition processes, for example, CVD, PECVD, atomic layer deposition (ALD), evaporation, physical vapor deposition (PVD), chemical solution deposition, or other like processes. The thickness of the high-k dielectric films 108 can vary depending on the deposition process as well as the composition and number of high-k dielectric materials used. The high-k dielectric film 108 can have a thickness in a range, for example, from about 0.5 to about 20 nm.

The work function metals can be disposed over the high-k dielectric films 108. The type of work function metal depends on the type of transistor and can differ between the nFET and pFET devices. P-type work function metals include compositions such as ruthenium, palladium, platinum, cobalt, nickel, and conductive metal oxides, or any combination thereof. In at least one embodiment, the p-type work function metal includes titanium nitride (TiN). N-type work function metals include compositions such as hafnium, zirconium, titanium, tantalum, aluminum, metal carbides (e.g., hafnium carbide, zirconium carbide, titanium carbide, and aluminum carbide), aluminides, or any combination thereof. The work function metals can be deposited by a suitable deposition process, for example, CVD, PECVD, PVD, plating, thermal or e-beam evaporation, and sputtering.

The gate structures 106a, 106b, 106c further include a surrounding top spacer 112, which can be deposited over the high-k dielectric films 108 and work function metals to form the HKMG. The top spacers 112 can be formed from a dielectric material including, but not limited to silicon nitride (SiN).

In some embodiments of the present invention, the gate structures 106a, 106b, 106c are overfilled above the top surface of the fins 104a, 104b, 104c and then recessed below the top surface of the semiconductor fins 104a, 104b, 104c using, a wet or dry etching process, for example, to expose a top end of the fins 104a, 104b, 104c. An interlayer dielectric (ILD) 114 can be deposited on the substrate 102, and then patterned (115) to expose the top ends of the fins 104a, 104b, 104c. The ILD 114 can be any suitable dielectric material, such as, for example, a silicon oxide, and can be formed using any suitable process. In some embodiments of the present invention, the ILD 114 is planarized to an upper surface of the top spacers 112 using, for example, CMP.

Figure 2:
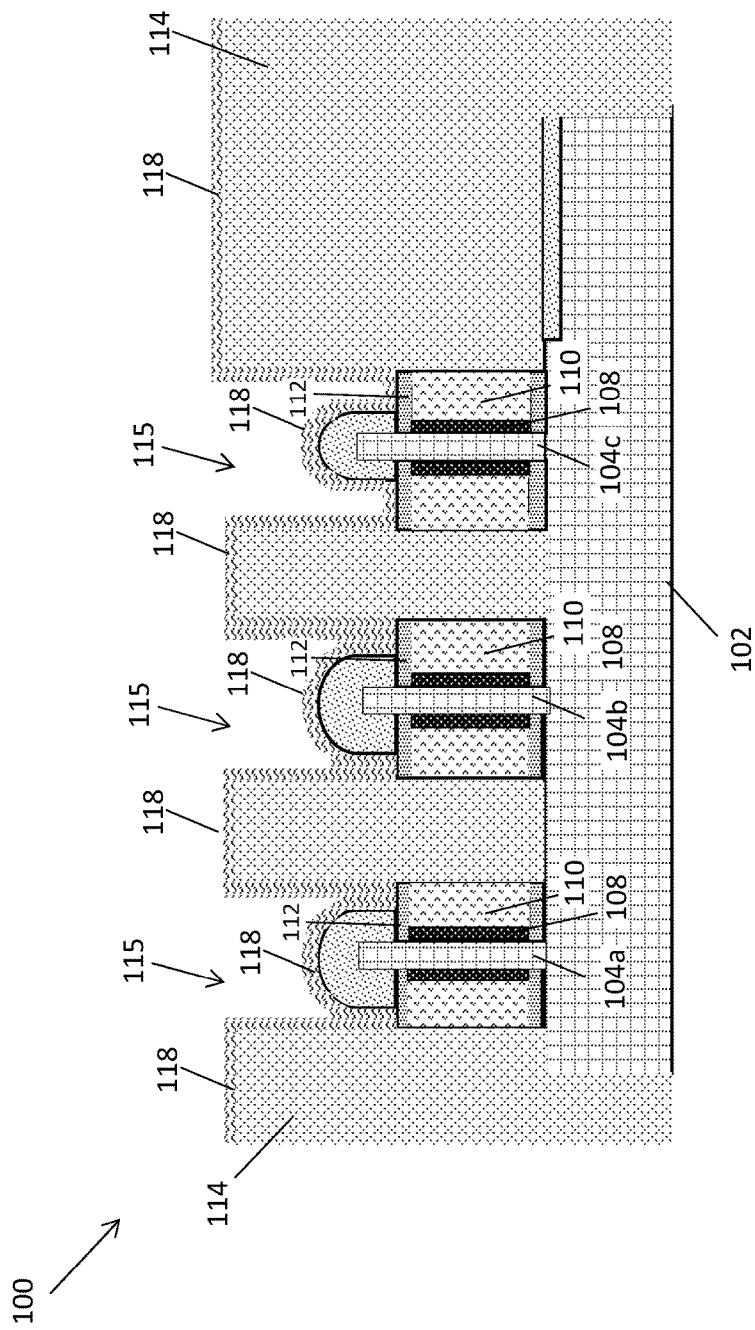
FIG. 2 depicts a cross-sectional view of the semiconductor structure after a processing operation according to one or more embodiments of the present invention.

Still referring to FIG. 1, the structure 100 is illustrated after forming TSD regions 116a, 116b, and 116c during an intermediate operation of a method of fabricating a semiconductor device according to one or more embodiments of the invention. The TSD regions 116a, 116b and 116c can be epitaxially grown using various know epitaxy techniques. For example, epitaxial materials can be grown from gaseous or liquid precursors using CVD, VPE, MBE, or LPE. The TSD regions 116a, 116b and 116c can be doped during deposition (in-situ doped) by adding dopants, n-type dopants (e.g., phosphorus or arsenic) or p-type dopants (e.g., boron or gallium), depending on the type of transistor. The dopant concentration in the TSD regions 116a, 116b and 116c can range from about 1×1019 cm−3 to about 2×1021 cm−3, for example, from about 2×1020 cm−3 to about 1×1021 cm−3. In some embodiments of the present invention, the TSD regions include the same material 116a, 116b, and 116c. Accordingly, the semiconductor device 100 can include all the same type of transistors, e.g., all N-type transistor or all P-type transistors. In other embodiments of the present invention, one or more of the TSD regions 116a, 116b and 116c include a first semiconductor material, while one or more of the TSD regions 116a, 116b and 116c include a different second material. In this manner, the semiconductor device 100 can be different types of transistors, e.g., some being N-type transistor and other being P-type transistors Turning now to FIG. 2, the semiconductor structure 100 is illustrated after depositing a conductive film 118 that conforms to an upper surface to the ILD 114 and the outer surface of the TSD regions 116a, 116b and 116c. In some embodiments of the present invention, the conductive film 118 is pinched-off between sidewalls of the ILD 114 and the TSD regions 116a, 116b and 116c. In other embodiments of the invention, the conductive film 118 conforms to the sidewalls of the ILD 114, along with the upper surface of the top spacer 112 and the outer surface of the TSD regions 116a, 116b and 116c.

In some embodiments of the present invention, the conductive film includes a plurality of individual layers. For example, a first layer of Ti or Ti/Co, for example, can be deposited to conform to the ILD 114 and TSD regions 116a, 116b 116c. A second layer of TiN, Ni, Pt, Co, or Ni/Pt, for example, can then be deposited on the first layer.

Figure 3:
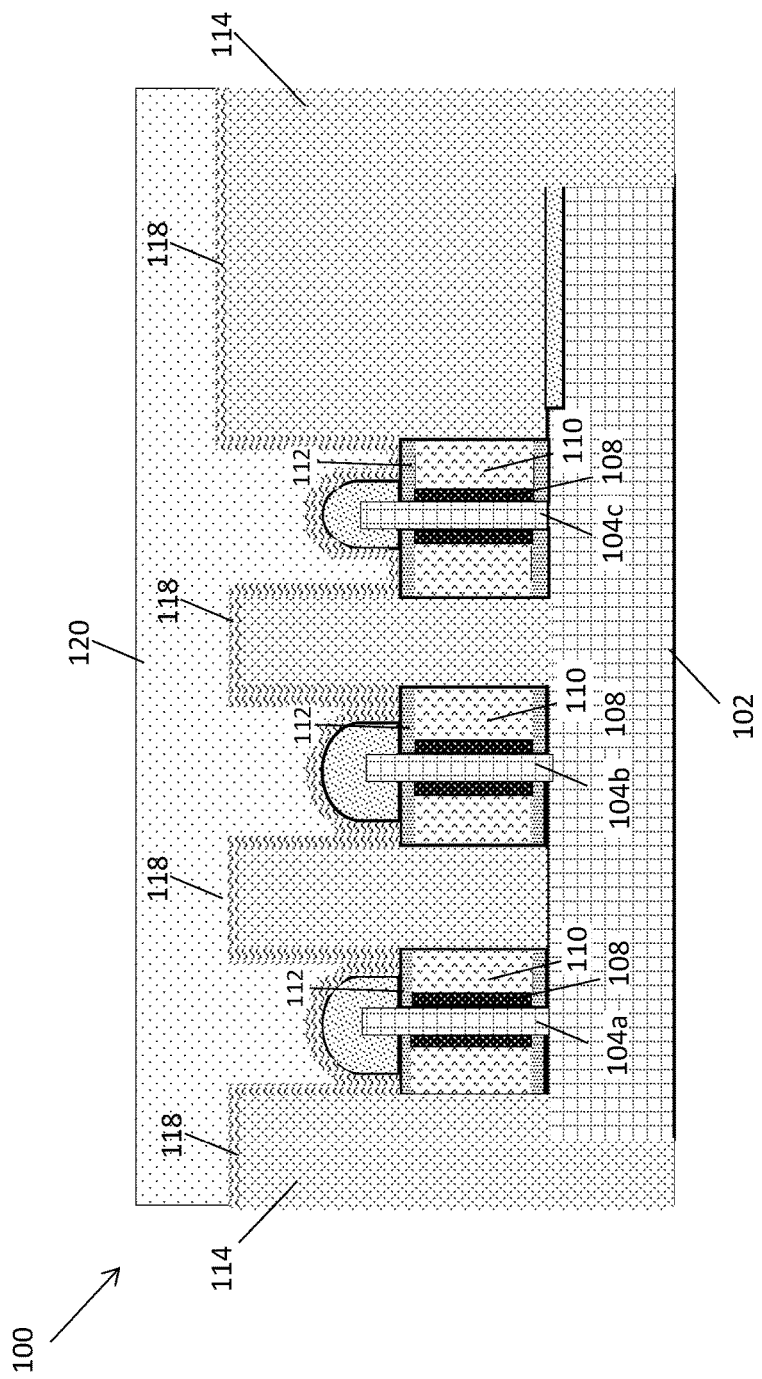
FIG. 3 depicts a cross-sectional view of the semiconductor structure after a processing operation according to one or more embodiments of the present invention.

Turning to FIG. 3, the semiconductor structure 100 is illustrated following the formation of a TSD insulator 120 on an upper surface of the semiconductor device 100. The TSD insulator 120 is deposited on an upper surface of the conductive film 118 and fills the voids 115 to completely cover the TSD regions 116a, 116b 116c. Non-limiting examples of suitable materials for the TSD insulator 120 include, but are not limited to, a middle-of-the-line (MOL) dielectric material, various oxide materials (e.g., SiO₂) and various nitride materials (SiN).

Figure 4:
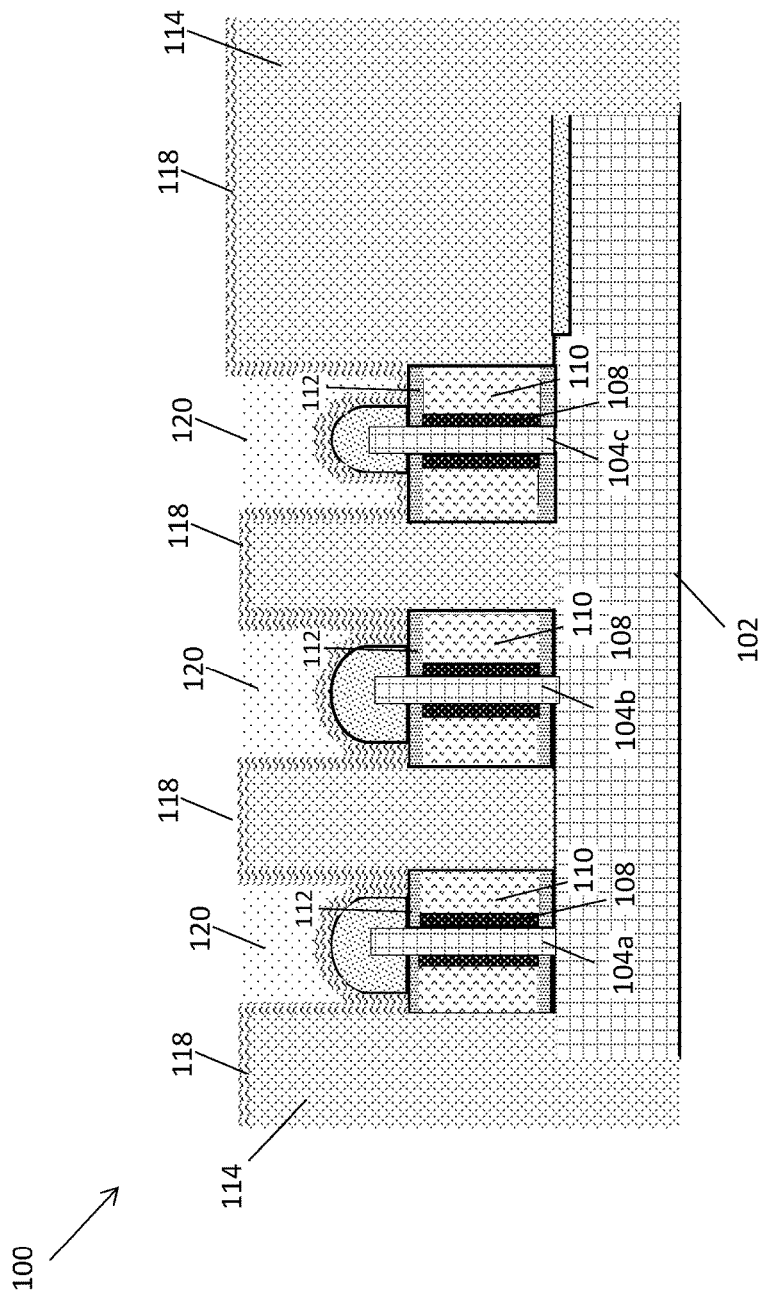
FIG. 4 depicts a cross-sectional view of the semiconductor structure after a processing operation according to one or more embodiments of the present invention.

In some embodiments of the present invention, the TSD insulator 120 can be planarized as shown in FIG. 4. For example, performing a dielectric chemical-mechanical planarization (CMP) process that is selective to the TSD insulator material will recess TSD insulator 120 until reaching the conductive film 118 where it will stop or minimally remove material. A CMP process that employs in situ laser ellipsometry can achieve an endpoint detection that preserves about 3 nm or more, for example, of the underlying conductive film 118. In this manner, the upper surface of the TSD insulator 120 can be formed flush (i.e., co-planar) with the upper surface of the conductive film 118.

Figure 5:
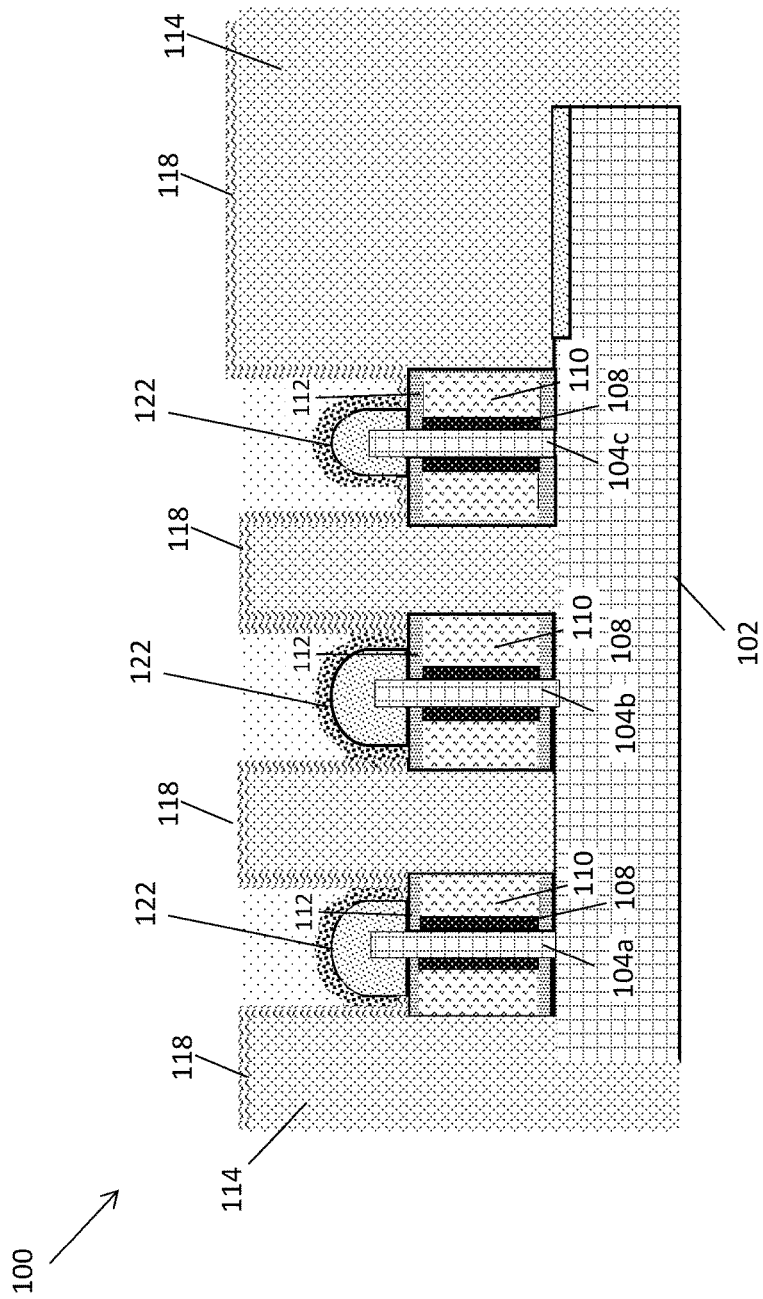
FIG. 5 depicts a cross-sectional view of the semiconductor structure after a processing operation according to one or more embodiments of the present invention.

Turning to FIG. 5, the semiconductor structure 100 is illustrated after performing an anneal processes such as, for example, a rapid temperature anneal (RTA) process or a laser spike anneal (LSA) process. A RTA process, for example, involves exposing the semiconductor device 100 to a temperature ranging from about 650 degrees Celsius to about 1100 degrees Celsius for approximately 10 seconds. The anneal process causes the material of the conductive film 118 to react with the epi material of the underlying TSD regions 116a, 116b and 116c. Accordingly, a portion of the conductive film 118 is converted into a TSD cap 122. The TSD cap 122 is formed as a binary compound of the TSD region material with a more electropositive element or group. In some embodiments of the present invention, a portion of the conductive film 118 reacts with the material (e.g., silicon) of the TSD regions 116a, 116b, 116c to form silicide TSD caps 122. In some embodiments of the invention, the TSD caps 122 completely surround the exposed surfaces of the TSD regions 116a, 116b, 116c.

Figure 6:
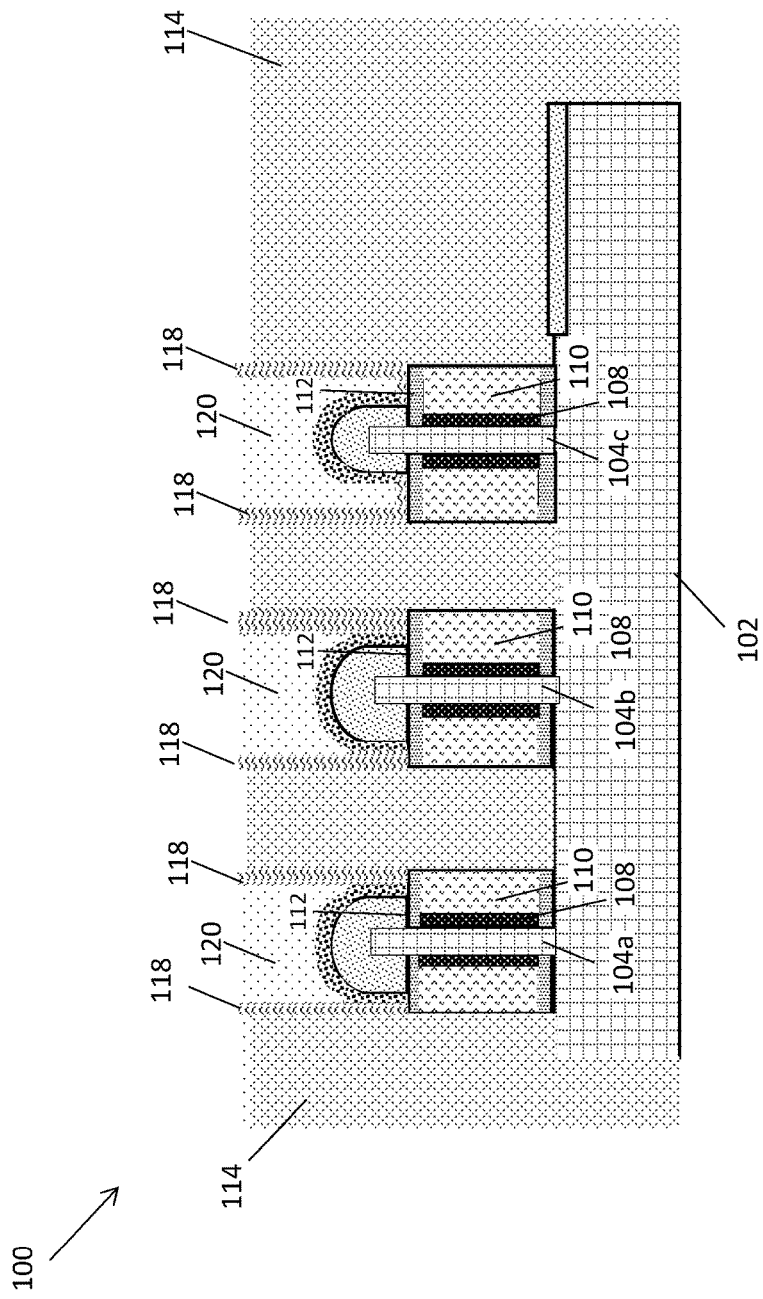
FIG. 6 depicts a cross-sectional view of the semiconductor structure after a processing operation according to one or more embodiments of the present invention.
Figure 7:
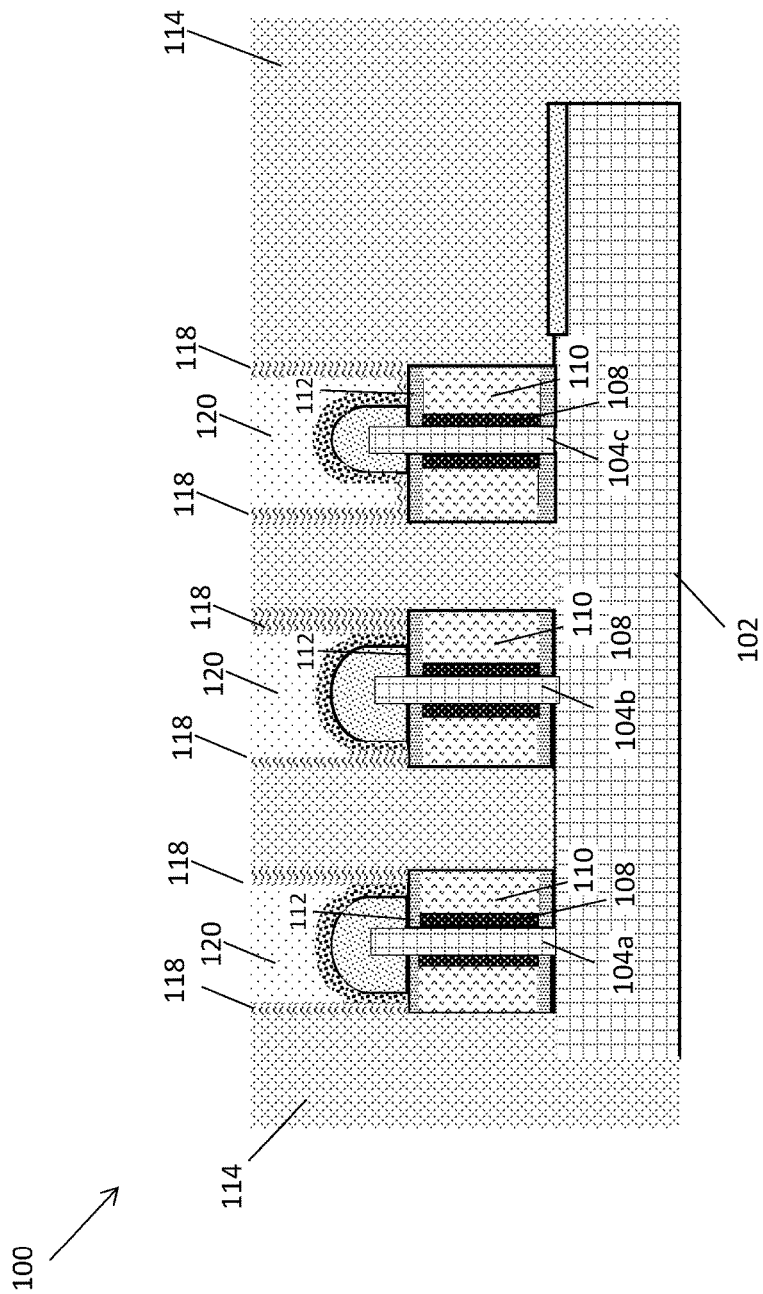
FIG. 7 depicts a cross-sectional view of the semiconductor structure after a processing operation according to one or more embodiments of the present invention.

Turning to FIG. 6, the semiconductor structure 100 is illustrated after removing the remaining conductive film 118 from the upper surface of the ILD 114. A wet etch selective to the conductive film material can be applied to remove the conductive material while stopping on the ILD 114. A CMP process can then applied to recess the remaining portion of the conductive film 118 so that the upper surface of the ILD 114 and conductive film 118 are flush (i.e., co-planar) with one another as shown in FIG. 7.

In some embodiments of the present invention, a CMP process can be performed instead of the wet etch process described in FIG. 6. The CMP process is capable of removing the ILD 114 from the upper surface of the ILD 114 while also planarized together the ILD 114 and remaining portions of the conductive film 114 interposed between the ILD 114 and the TSD insulator 120 in a single step. In either case, the conductive film 118 can be removed to expose the underlying ILD 114.

Figure 8:
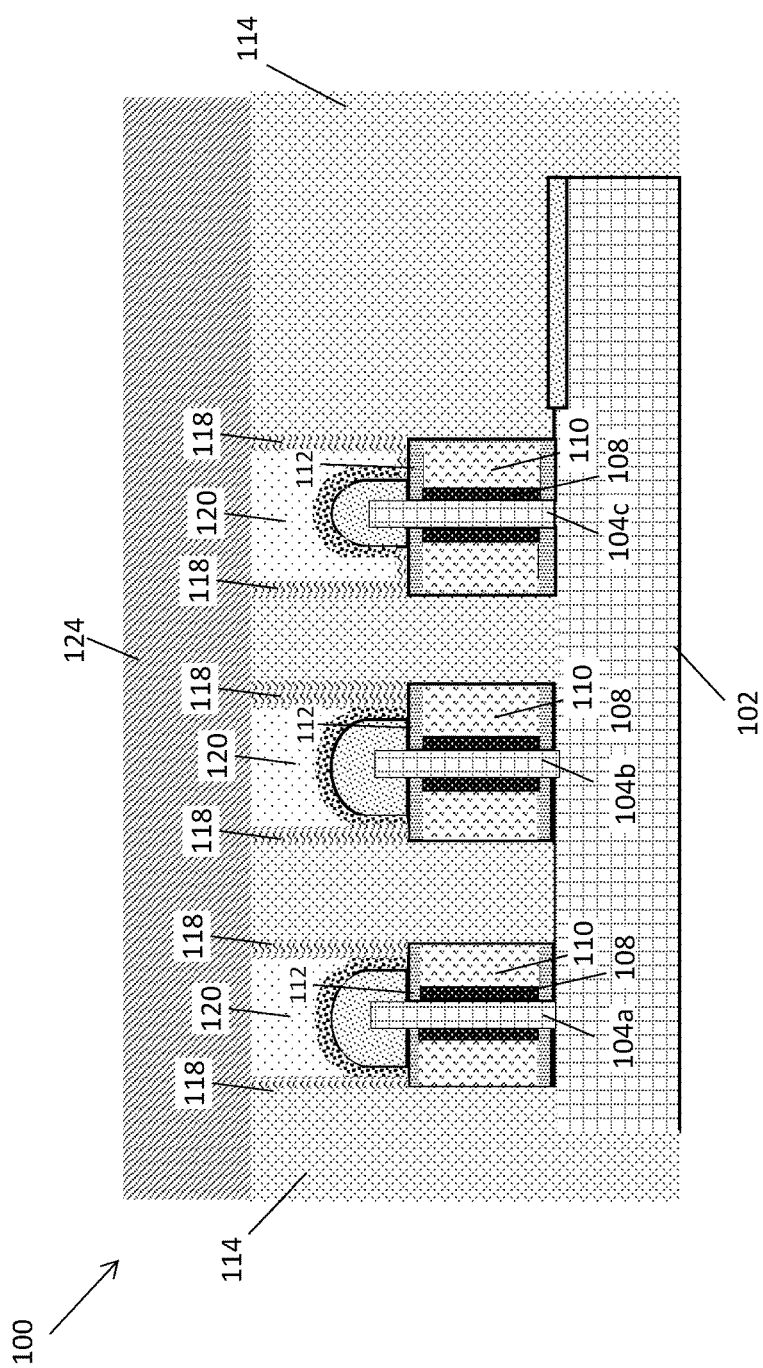
FIG. 8 depicts a cross-sectional view of the semiconductor structure after a processing operation according to one or more embodiments of the present invention.

Referring to now to FIG. 8, a via insulating layer 124 (sometimes referred to as a MOL ILD) is deposited on an upper surface of the semiconductor substrate 100. Non-limiting examples of suitable materials for the via insulating layer 124 include, but are not limited to, a middle-of-the-line (MOL) dielectric material, various oxide materials (e.g., SiO₂) and various nitride materials (SiN). Accordingly, the via insulating layer 124 can serve to isolate one or more electrically conductive vias subsequently formed in the semiconductor conductor device 100 as described in greater detail below.

Figure 9:
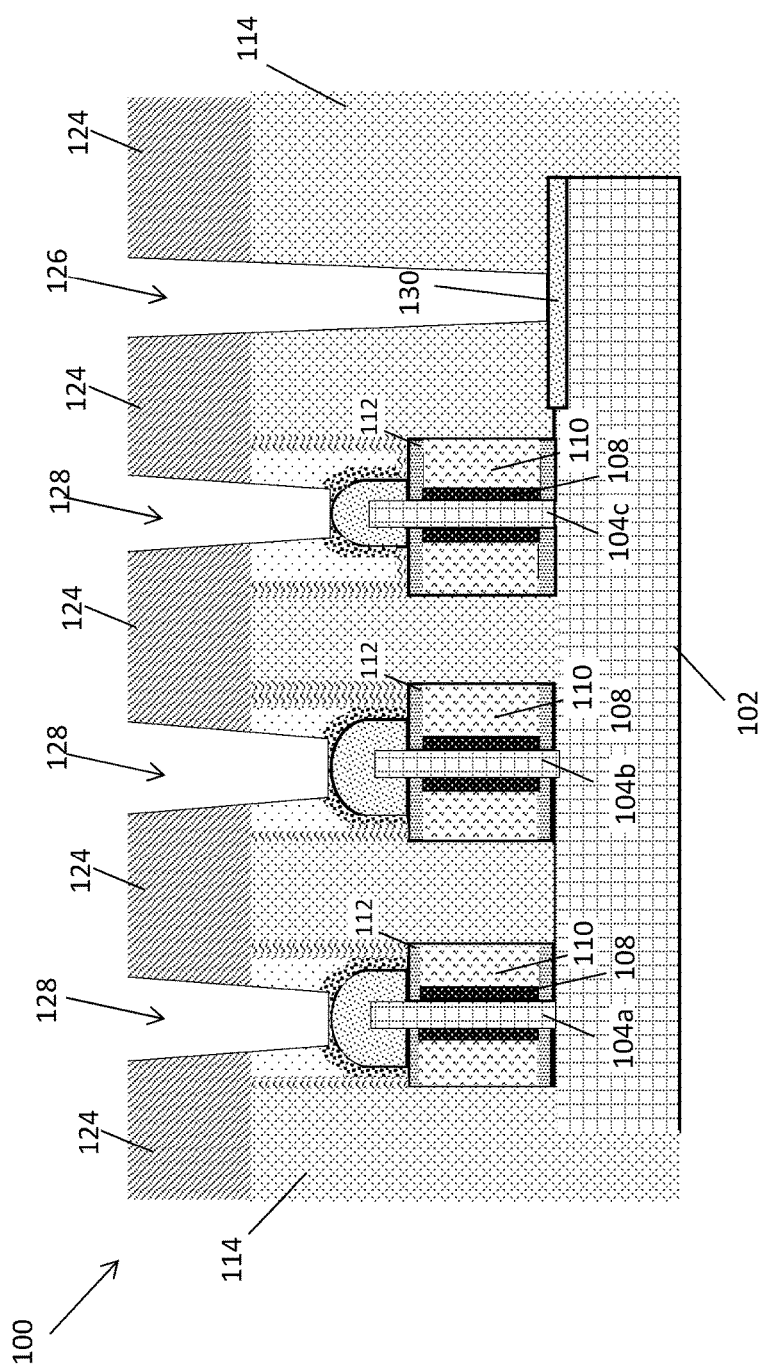
FIG. 9 depicts a cross-sectional view of the semiconductor structure after a processing operation according to one or more embodiments of the present invention.

Turning to FIG. 9, the semiconductor structure 100 is illustrated following formation of a bottom source/drain (BSD) trench 126 and TSD trenches 128. The BSD trench 126 and TSD trenches 128 can be formed by patterning a top photomask (not shown) formed on an upper surface of the via insulating layer 124, and transferring the pattern into the semiconductor structure 100 using, for example, an RIE process. The BSD trench 126 stops on an upper surface of a BSD region 130 formed on the substrate 102.

The TSD trenches 128 extend through TSD dielectric 120 to expose an upper surface of the TSD conductive caps 122. In some embodiments of the present invention, the silicide TSD caps 122 increase the selectivity of the RIE process. For example, a silicide TSD cap 122 (e.g., TiN/silicide)

according to embodiments of the present invention is less reactive to the chemistry of the RIE compared to a bare or uncovered silicon TSD region. As a result, the silicide TSD cap 122 avoids unwanted deep gouging that commonly occurs when performing an RIE in contact with an uncovered silicon TSD region. The silicide TSD cap 122 also has a low resistance and therefore does not negatively impact the electrical conductivity between the subsequent TSD contact vias 134 and respective TSD regions 116a, 116b and 116c. Accordingly, an electrically conductive path can be established between the TSD contact vias 134 and the BSD region 130.

Figure 10:
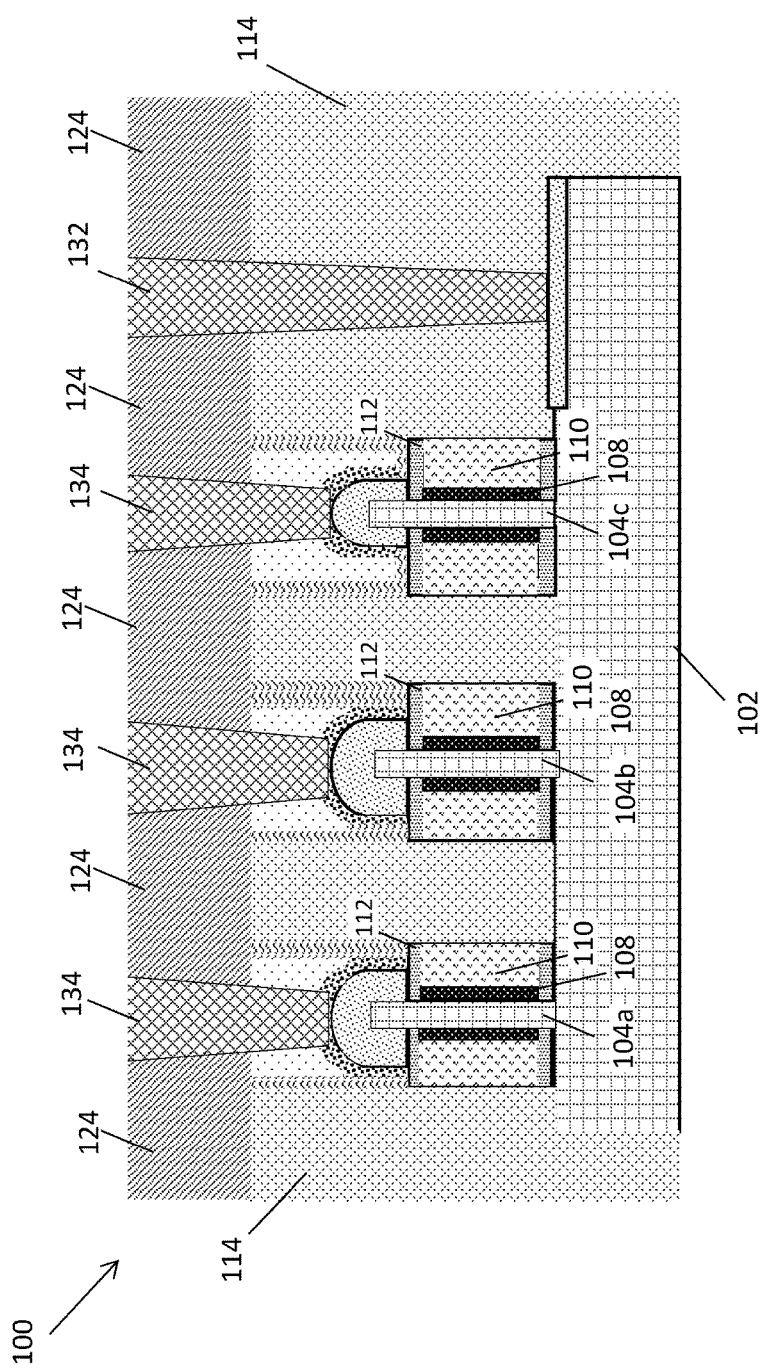
FIG. 10 depicts a cross-sectional view of the semiconductor structure after a processing operation according to one or more embodiments of the present invention.

Turning to FIG. 10, the semiconductor structure 100 is illustrated after depositing a conductive material in the BSD trench and TSD trenches to form a BSD contact 132 via and TSD contact via 134, respectively. The BSD contact via 132 is formed in ohmic contact with the BSD region 130, while the TSD contact vias 134 are formed in ohmic contact with the TSD conductive caps 122. In some embodiments of the present invention, the BSD trench and TSD trenches can be overfilled with the conductive material, and then planarized using a CMP process so that the upper surface of the BSD contact via 132 and TSD contact vias 134 are flush with the upper surface of the via insulating layer 124.

The conductive material deposited in the BSD trench and TSD trenches can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In some embodiments of the present invention, the BSD contact via 132 and TSD contact vias 134 can be copper or tungsten and can include a barrier metal liner (not depicted). The barrier metal liner prevents the copper or tungsten from diffusing into, or doping, the surrounding materials, which can degrade their properties. Silicon, for example, forms deep-level traps when doped with copper. An ideal barrier metal liner limits bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

Figure 11:
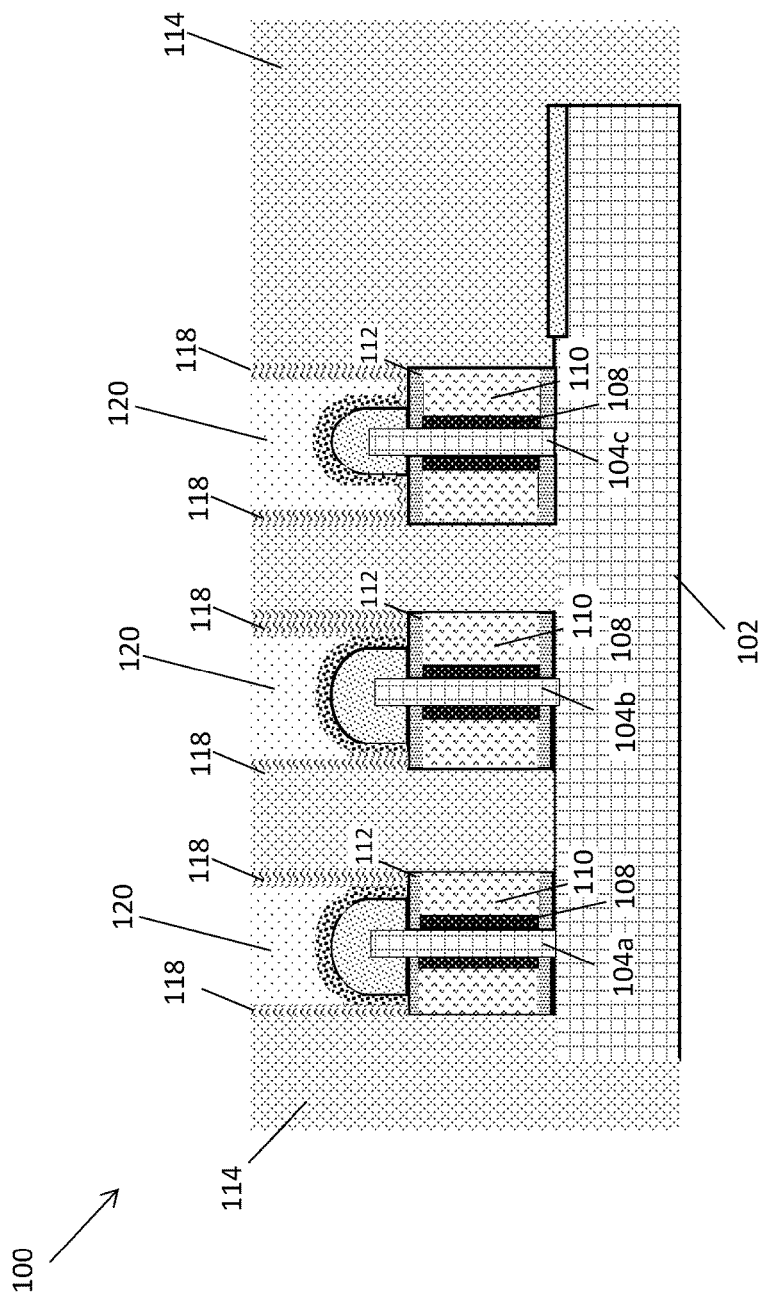
FIG. 11 depicts a cross-sectional view of the semiconductor structure after a processing operation according to one or more embodiments of the present invention.

In some embodiments of the present invention, the conductive film (118) can be recessed (by wet etch or RIE) prior to patterning the TSD contact vias 134. FIG. 11 depicts the semiconductor structure 100 following a CMP process that forms the upper surface of the ILD 114 flush (i.e., co-planar) with the remaining conductive film 118 during an intermediate operation of a method of fabricating a semiconductor device according to one or more embodiments of the invention.

Figure 12:
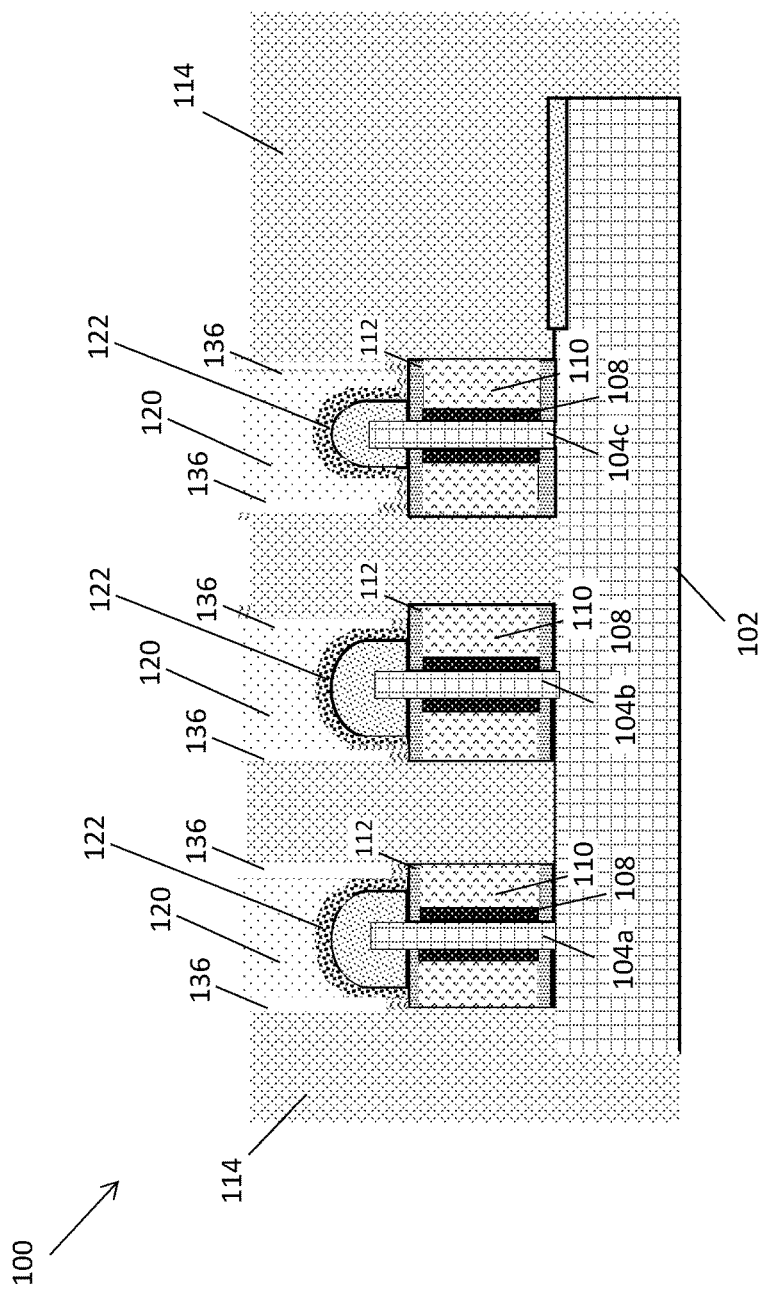
FIG. 12 depicts a cross-sectional view of the semiconductor structure after a processing operation according to one or more embodiments of the present invention.

At FIG. 12, the semiconductor structure 100 is depicted after vertically recessing the remaining conductive film 118 during an intermediate operation of a method of fabricating a semiconductor device according to one or more embodiments of the invention. In some embodiments of the present invention, a wet etching process is performed to etch the conductive film 118 while preserving the dielectric film 120. Accordingly, voids 136 are formed between the ILD 114 and the TSD insulator 120. The etching can be controlled so that the remaining conductive film 118 is not recessed below the TSD cap 122.

Figure 13:
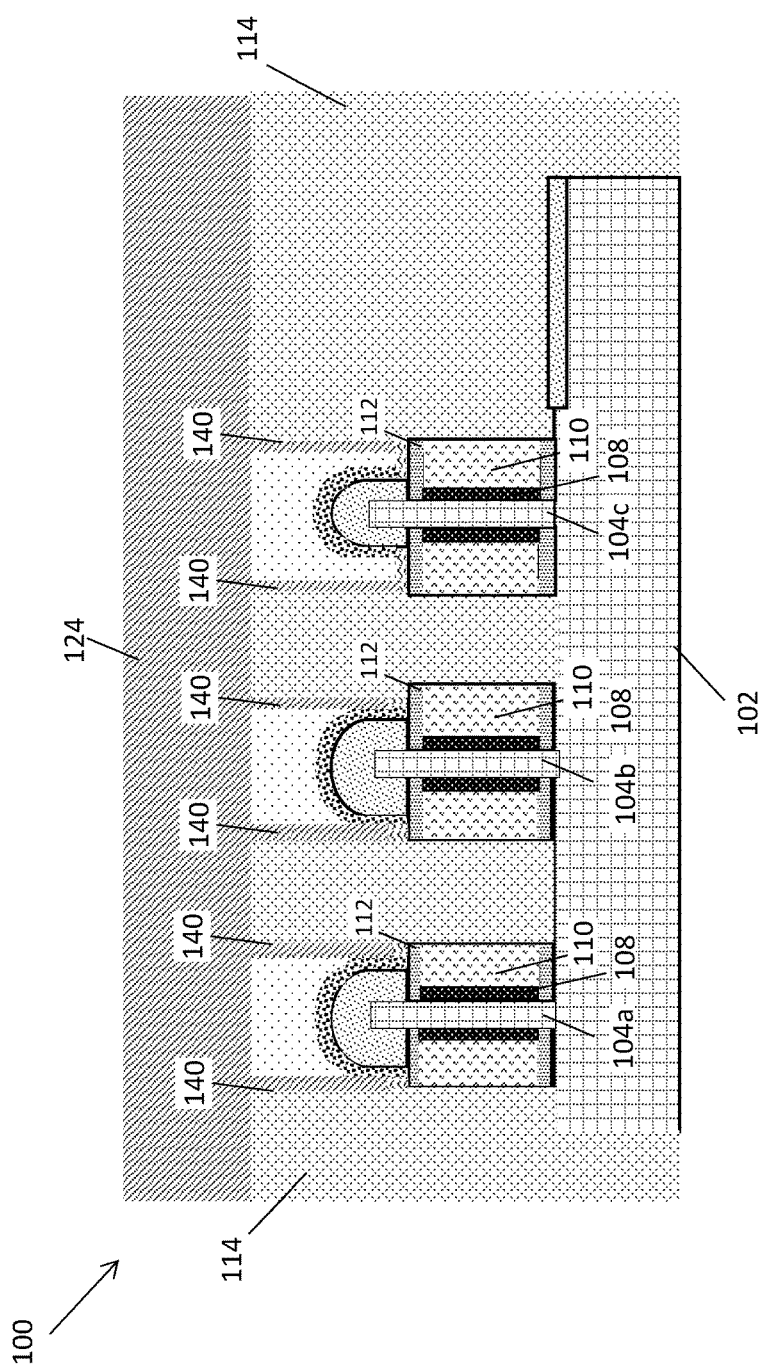
FIG. 13 depicts a cross-sectional view of the semiconductor structure after a processing operation according to one or more embodiments of the present invention.

Turning to FIG. 13, the via insulating layer 124 is deposited on an upper surface of the semiconductor substrate 100. In this non-limiting embodiment of the invention, the via insulating layer 124 fills the cavities to form individual dielectric trench liners 140. In some embodiments of the invention, the dielectric trench liners 140 are formed against sidewalls of the TSD insulator 120, and extend between a top end and an opposing bottom end. The top end contacts the via insulating layer 124 while the bottom end contacts the remaining conductive film 118.

Figure 14:
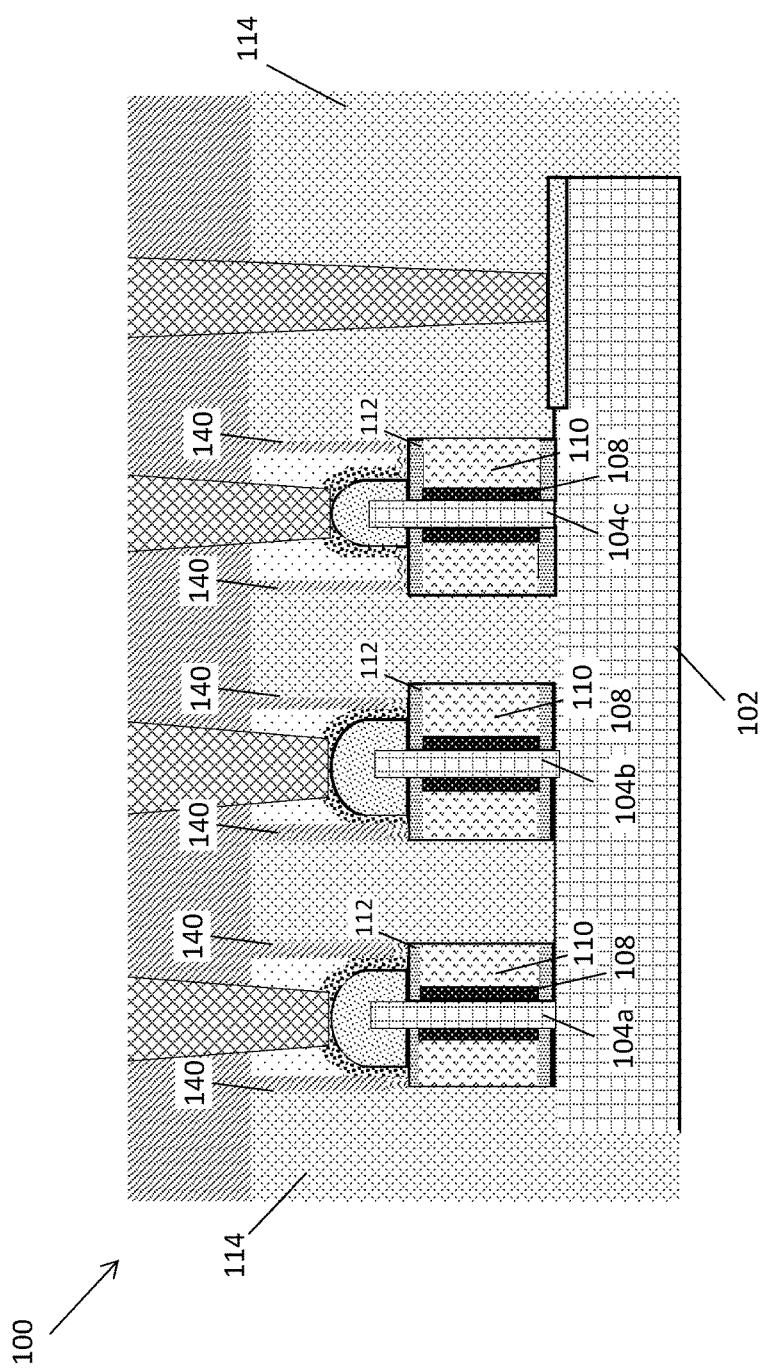
FIG. 14 depicts a cross-sectional view of the semiconductor structure after a processing operation according to one or more embodiments of the present invention.

At FIG. 14, the semiconductor device 100 is illustrated following formation of the BSD contact via 132 and the TSD contact vias 134. The TSD contact vias extend through the TSD insulator 120 and establish ohmic contact with the TSD caps 122. Accordingly, each TSD contact via is located between a pair of dielectric trench liners 140.

Accordingly, various non-limiting embodiments described above provide methods and structures configured to reduce the resistance in the TSD region of a VTFET. In one or more embodiments, an electrically conductive cap is formed on the TSD region, which reduces the resistance between the TSD region and a subsequently formed TSD contact element. Not only is the electrically conductive cap formed from a low-resistance material (e.g., a metal material), it increases the overall contact area available to the TSD contact element. In this manner, the overall contact resistance in the TSD region of the VTFET is reduced.

Various embodiments of the present invention are described herein with reference to the related drawings. Alternative embodiments of the present invention can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on the semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:
   forming a bottom source/drain region on a semiconductor substrate;
   forming a vertical semiconductor fin including a bottom end that contacts the semiconductor substrate and is in electrical communication with the bottom source/drain region;
   forming a gate structure that wraps completely around all sidewalls the vertical semiconductor fin, wherein a top end of the vertical semiconductor fin extends above the gate structure;
   depositing an interlayer dielectric (ILD) on an upper surface of the substrate and subsequently patterning the ILD layer to form a patterned trench that expose the top end of the vertical semiconductor fin;
   forming a top source/drain region by epitaxially growing silicon within the patterned trench and from the top end of the vertical semiconductor fin and on sidewalls of the vertical semiconductor fin, the top source/drain region formed directly on an upper surface of the gate structure separated from the semiconductor substrate by the vertical semiconductor fin;
   forming an electrically conductive cap within the patterned trench and on an outer surface of the top source/drain region; and
   forming an electrically conductive contact via in ohmic connection with the electrically conductive cap to establish an electrically conductive path from the contact via to the bottom source/drain region,
   wherein forming an electrically conductive cap within the patterned trench comprises:
   depositing an electrically conductive film directly on sidewalls and a base of the patterned trench, and directly on exposed surfaces of the top source/drain region;
   depositing a dielectric material in the patterned trench so as to encapsulate the electrically conductive film deposited in the trench and on the top source/drain region with the dielectric material; and
   performing a temperature anneal process that converts the electrically conductive film formed on the top source/drain region into the electrically conductive cap that is encapsulated by the dielectric material.

2. The method of claim 1, wherein the temperature anneal process converts the electrically conductive film into a binary compound of a semiconductor material included in the top source/drain region.

3. The method of claim 2, wherein the electrically conductive film is converted to a silicide material that defines the conductive cap.

4. The method of claim 3, wherein forming the electrically conductive contact via comprises:
   encapsulating the electrically conductive cap with a dielectric material;
   selectively forming a top source/drain (TSD) trench that extends through the dielectric material and stops on the electrically conductive cap; and
   depositing an electrically conductive material in the TSD trench to establish ohmic connection with the electrically conductive cap.

5. The method of claim 4, wherein the gate structure includes a bottom portion that directly contacts the semiconductor substrate and a top portion that directly contacts the top source/drain region.

6. The method of claim 5, wherein gate structure is interposed between the semiconductor substrate and the electrically conductive cap.

7. The method of claim 4, wherein the TSD trench is formed after converting the electrically conductive film into the electrically conductive cap.

* * * * *